(12) United States Patent
Nilsson et al.

(10) Patent No.: US 9,155,225 B2
(45) Date of Patent: Oct. 6, 2015

(54) AIR HEATER FOR AN AIR INLET OF AN ELECTRIC SYSTEM

(75) Inventors: Torbjörn Nilsson, Vallda (SE); Bo Josefsson, Mölndal (SE); Johan Billmark, Göteborg (SE)

(73) Assignee: SAAB AB, Linköping (SE)

( * ) Notice: Subject to any disclaimer, the term of this patent is extended or adjusted under 35 U.S.C. 154(b) by 695 days.

(21) Appl. No.: 13/574,673

(22) PCT Filed: Feb. 5, 2010

(86) PCT No.: PCT/SE2010/050143
§ 371 (c)(1),
(2), (4) Date: Jul. 23, 2012

(87) PCT Pub. No.: WO2011/096866
PCT Pub. Date: Aug. 11, 2011

(65) Prior Publication Data
US 2012/0291996 A1   Nov. 22, 2012

(51) Int. Cl.
| | |
|---|---|
| *H05K 7/20* | (2006.01) |
| *F24H 3/04* | (2006.01) |
| *F24H 3/00* | (2006.01) |
| *B64D 13/06* | (2006.01) |
| *B24D 13/06* | (2006.01) |
| *B24D 13/08* | (2006.01) |

(52) U.S. Cl.
CPC .......... *H05K 7/20209* (2013.01); *F24H 3/002* (2013.01); *F24H 3/0429* (2013.01); *B24D 13/06* (2013.01); *B24D 13/08* (2013.01); *B64D 2013/0614* (2013.01); *H05K 7/20845* (2013.01)

(58) Field of Classification Search
CPC .......... H05K 7/20209; H05K 7/20845; H05K 7/20863; H05K 7/20918; B60R 19/52; B64D 13/006; B64D 13/08; B64D 15/12; B64D 2013/0614; F24H 3/02; F24H 3/0429; F24H 3/002
USPC .......... 165/42, 45; 454/76; 392/347, 350, 360, 392/368; 219/202
See application file for complete search history.

(56) References Cited

U.S. PATENT DOCUMENTS

| | | | | |
|---|---|---|---|---|
| 2,902,597 | A * | 9/1959 | Leidy et al. ............... | 244/117 R |
| 3,013,745 | A * | 12/1961 | Galway et al. ............. | 174/15.1 |
| 3,062,484 | A * | 11/1962 | Himka ...................... | 244/53 R |
| 3,783,935 | A * | 1/1974 | Simmons et al. ........... | 165/44 |
| 4,275,857 | A * | 6/1981 | Bergsten ................... | 244/53 B |
| 4,674,704 | A * | 6/1987 | Altoz et al. ............... | 244/1 R |
| 4,899,958 | A * | 2/1990 | Horikawa .................. | 244/53 B |
| 6,313,810 | B1 * | 11/2001 | Andersson et al. ......... | 343/872 |

(Continued)

OTHER PUBLICATIONS

PCT/ISA/210—International Search Report—Oct. 8, 2010.

(Continued)

*Primary Examiner* — Marc Norman
*Assistant Examiner* — Jon T Schermerhorn
(74) *Attorney, Agent, or Firm* — Venable LLP; Eric J. Franklin

(57) ABSTRACT

An air heater arranged in an air pipe of an electronic system of a radar antenna. The electronic system is mounted on a body of an aircraft and the electronic system is enclosed in a housing with at least one air inlet that is adapted to provide outside air for cooling of the electronic system. The air pipe is located between the air inlet and the electronic system.

15 Claims, 4 Drawing Sheets

(56) References Cited

U.S. PATENT DOCUMENTS

2002/0162345 A1* 11/2002 Laugt ............................ 62/239
2003/0145980 A1    8/2003 Sinha
2008/0001841 A1    1/2008 Alberding et al.

OTHER PUBLICATIONS

PCT/ISA/237—Written Opinion of the International Searching Authority—Oct. 8, 2010.

* cited by examiner

AIR HEATER FOR AN AIR INLET OF AN ELECTRIC SYSTEM

CROSS-REFERENCE TO RELATED APPLICATIONS

This application is the national phase under 35 U.S.C. §371 of PCT/SE2010/050143 filed 5 Feb. 2010.

TECHNICAL FIELD

This invention relates generally to airborne electronic systems and more particularly to an air heater for a cooling system of the electronic system of a radar antenna mounted on an aircraft.

BACKGROUND ART

During the use of the radar antennas, the components in the electronic system of the radar antenna heats up and must be cooled not to be overheated. Electronic systems of radar antennas mounted on the body of an aircraft are, during flight, cooled by the airflow from the surrounding air. The electronic system is arranged within a housing, wherein the airflow is lead into the components of the electronic system through an air inlet and an air pipe. The electronic system of the radar antenna is thereby exposed to varied temperatures, wherein the lowest temperatures are below −55° C.

Due to the very low temperature caused by airflow, special designed components are used in the electronic system of the radar antenna. The special designed components can withstand lower temperatures than conventional industrial components; this makes the electronic system of the radar antenna more insensitive to low temperatures. For industrial components used today the critical temperature is normally at −40° C. The special designed components are supplied by just a few suppliers and are much more expensive than conventional components.

The electronic systems must not just be designed to be able to stand low temperatures; the same system is subjected to high temperatures, essentially because of the heating effect of the system itself. For electronic system with soldered components, the temperature can not be allowed to be raised above the critical temperature +85° C., because the soldered seems can start to degrade.

DESCRIPTION

It is therefore an object of the invention to provide a device which facilitates the use of sensitive industrial components in an electronic system of a radar antenna mounted on a body of an aircraft.

The present invention is directed to solve the aforementioned problems of the prior art. In accordance with criteria used for the application of devices for airborne operation any system must be low cost, light weight, small in volume and consume a minimum amount of power.

The air heater according to the invention is located between an air inlet and an electronic system of a radar antenna, said electronic system is mounted on the body of an aircraft. The electronic system is enclosed in a housing with at least one air inlet, that is adapted to provide outside air for cooling of the electronic system, further, an air pipe is located between the air inlet and the electronic system.

To achieve a raised temperature of outside air taken in by the air inlet, it seems attractive to just increase the speed of the aircraft, whereby the aerodynamic heating would increase. However, the aerodynamic heating would in fact not be enough in the present case. The aerodynamic heating would not be sufficient to raise the temperature of the air taken in above the critical temperature for the industrial components.

Thereby, a conventional heater, for heating the outside air flowing into the air inlet could seem interesting. Because of the high speed of the aircraft, the heater must heat huge volumes of air. Accordingly, the heater would get high energy consumption. As long as the heater is the only major electric energy consumer in the aircraft, this would not be a problem. But, when the electronic system, i.e. the radar system, or parts of it, is in operation at the same time as the heater, the generator of the aircraft won't be able to supply both the heater and the electronic system with the power needed.

Hence, just placing a conventional air heater in the air inlet and/or air pipe would not solve the problem with satisfactory results.

The invention rests upon the findings, that when the air is warm, i.e. up to +30° C., the airflow through the electronic system can be restricted, and the desired cooling effect on the components of the electronic system would still sufficient, when the radar antenna is in use. Further, a restricted airflow of outside air with a temperature below a critical temperature can be heated to temperatures above the critical temperature, with less energy consumption than if the airflow was not restricted.

An air heater is therefore suggested, wherein the inventive air heater is mounted in the air pipe between the air inlet and the electronic system and comprises heating means and regulating means. When the aircraft is in the air, the regulating means is arranged to restrict an airflow which arises through the air pipe. The regulating means is invariable, such that it just can restrict the air flow stationary, not varying it.

The heating means is arranged and dimensioned to heat the restricted airflow such, that the temperature of the restricted airflow after it has passed the heating means is maintained above a first predetermined threshold value.

Further, the cooling effect of the restricted airflow, on the electronic system, is maintained above a second predetermined threshold value, when the temperature is below a third predetermined threshold value.

The first predetermined threshold value is lower than the third predetermined threshold value, and the first, the second and the third predetermined threshold values are dependent on material properties of the components in the electronic system.

The first predetermined threshold value is essentially −40° C., as limited by the temperature limit for the industrial components in the electronic system. The second predetermined threshold value for the cooling effect is essentially 20 kW, preferably essentially 25 kW and more preferably essentially 35 kW. These are the cooling effects needed to keep the temperature of the electronic components of the electronic system below the critical temperature +85° C., during operation of the radar antenna and its electronic system. The cooling effect is thereby, the heat removed from the electronic system, by the airflow. With a higher cooling effect, a more efficient cooling of the electronic system and a greater margin to the critical temperature is maintained. The third predetermined threshold value is essentially +30° C., as limited by the operating temperatures of the radar antenna and the components in the electronic system. Obviously, through progress within the field of electronic components, these threshold values can change over time.

In situations where no heating of the air is necessary, i.e. when the temperature of the air taken in by the air inlet is −40° C. or above, the heating means can be turned off.

The regulating means is dimensioned such, that when the air has a temperature of essentially +30° C., i.e. the third predetermined value, the restricted airflow still maintains a cooling effect of at least 20 kW, preferably 25 kW and more preferably 35 kW, i.e. above the second predetermined threshold value. This cooling effect is sufficient to keep the temperature of the components in the electronic system below +85° C., during use of the electronic system.

Due to the regulating means, the restricted airflow becomes a lower flow rate, and thereby can the temperature of the air be raised with a heating means with less effect, than if the airflow wasn't restricted by the regulating means. The flow rate is important for calculating the effect needed to heat the air and to determine the cooling effect of the airflow. The flow rate is determined of the air pressure, viscosity of the air and the speed of the air craft. To calculate the flow rate is an Equivalent Air Speed (EAS) used for the calculations of the cooling effect. The EAS is the speed at sea level which gives the same dynamic pressure as the speed of the aircraft relative the surrounding mass of air, i.e. the True Air Speed (TAS).

Two worst case scenarios are to be considered. First, the cold case; when the temperature of the air is −55° C. at a height corresponding to 7100 meters above sea level and an EAS of 90 m/s. Second, the warm case; when the temperature of the air is +30° C., on a height corresponding to 2120 meters above sea level and an EAS of 80 m/s.

The inventive air heater with its regulating means and heating means achieves a lower energy consumption of the heater, since less air must be heated, to heat air below the first predetermined threshold value and reach the desired air temperature of at least −40° C., which is the first predetermined threshold value. When the flow rate of the airflow passing through the electronic system is decreased, the cooling effect of the airflow will also decrease. Thereby it is of important for the invention, that the regulating means is adapted such, that the flow rate of the airflow passing the regulating means is sufficient to cool the electronics as the air temperature is +30° C., i.e. the third predetermined threshold value. Thereby, the airflow must maintain a cooling effect on the electronic system of at least the second predetermined threshold value, essentially 20 kW, preferably essentially 25 kW and more preferably essentially 35 kW. This especially important for the warm case, i.e. air temperatures of +30° C. and an EAS of the aircraft of 90 m/s at a height corresponding to 7100 meters above sea level.

By restricting the airflow, heating means with a lower effect can be used to secure, that the temperature of the components in the electronic system is kept at a temperature above −40° C., i.e. above the first predetermined threshold value, relative if the airflow was not restricted. However, the cooling effect of the restricted airflow, at air temperatures about the third predetermined threshold value, i.e. +30° C., is maintained sufficient to cool the electronic system during use in these conditions.

A preferred heating means is an electronic heater. For safety reasons it is suggested that the electronic heater automatically switches off, if the temperature of the heating means exceeds a predetermined value.

In the air heater according to the invention, it is preferred that the heating means and the regulating means restricts the airflow such that, when the temperature of the airflow is below the first predetermined threshold value; −40° C., and especially when the temperature is essentially −55° C., the maximum heating effect required to heat the restricted airflow to at least the first predetermined threshold value; −40° C., is less than 20 kW, preferably less than 15 kW.

With an effect lower than 20 kW it want be a problem to activate the electronic system, i.e. radar system, at the same time as the heating means is activated. An even greater margin is achieved with an effect lower than 15 kW. The generator of the aircraft can manage to supply both consumers with the energy required.

Further, the regulating means restricts the airflow such that, when temperature of the airflow is below the third predetermined threshold value, the cooling effect of the restricted airflow, at a height corresponding to essentially 2120 meters above sea level, is at least essentially 20 kW, preferably at least essentially 25 kW and more preferably at least essentially 35 kW.

To achieve this cooling effect, and still reduce the flow rate of the airflow in the air pipe, there are several ways of design and construct the regulating means. Independent of its construction, the regulating means restricts the flow rate of the airflow with 40-50%, especially essentially 46%, during all the below listed conditions:

When the air temperature is −55° C., the aircraft is flying at a height equivalent to 7100 m above sea level and the speed of the aircraft is 80 m/s EAS.

When the air temperature is +30° C., the aircraft is flying at a height equivalent to 2120 meters above sea level and the speed of the aircraft is 90 m/s EAS.

When the air temperature is −55° C., the aircraft is flying at a height equivalent to 9141 meters above sea level and the speed of the aircraft is 80 m/s EAS.

To cool the electronic system, i.e. the radar system, when the aircraft is not in operation, an external cooling system which forces air to flow through the housing, is connected to the air inlet. It is therefore preferable, that the inventive air heater is attached to the housing with detachable attachment means. The air heater can thereby be demounted, when the aircraft is standing on the ground. The detachable attachment means, can be screw, bolts, click attachment means or other suitable detachable attachment means.

It is preferable, that the regulating means is mounted in the air pipe, closer to the air inlet than the heating means. Further, that the air heater additionally comprises an impact protection means also located in closer to the air inlet than the heating means. The impact protection means is protecting the heating means and the electronic components of the electronic system, such that if a bird or another foreign object collides with the housing and enters the air inlet, it does not damage these parts. To exchange a damaged protection means is much cheaper than if parts of the whole electronic system must be exchanged because of the impact with the foreign object.

To reduce the impact force on the heating means and the surrounding structure, the impact protection means is adapted to deform, if the regulating means is hit by a foreign object. Hence, the impact protection means is adapted such, that it has a deformation zone.

It is especially provided, that the impact protection means is integrated with the regulating means. The surface of the regulator means has thereby, a convex shape, when looking at the regulating means (6) from the air inlet such, that a deformation zone is created by the convex shape. The convex shape is a construction of the deformation zone which is easy to produce and which allows the impact protection means/regulating means to deform, such that the impact of the collision is reduced.

A construction of the regulating means, which is easy to produce and which in addition can be used as an impact protection means, is a plate placed in the airflow. Said plate must have at least one through opening. The at least one through opening in the plate restricts the flow rate of the air flowing through the air pipe. This particular regulating means can also be manufactured to a low price.

An alternative construction of the impact protection means is bars or a wire netting located in the airflow before the heating means. Also this impact protection means are preferably adapted to have a shape allowing it to reduce the impact with a foreign object.

In an alternative embodiment of the inventive air heater is the heating means and the regulating means integrally formed in one unit. Hence, either heating means additionally functions as the regulating means, i.e. restricting the air flow, or the regulating means additionally functions as the heating means, i.e. heating. Obviously the impact protection means can also be integrally formed in the same unit as the heating means and the regulating means.

The inventive air heater is preferably insulated attached to the housing of the electronic system. Due to the insulation, no energy is lead away from the heating means, and thereby lost. Further, the material of the housing may thereby be in a material sensitive for higher temperatures, like plastic of composite.

A preferred insulation material between the air heater and the housing is ceramic which possesses very good insulating qualities.

The inventive air heater is supposed to be used for an electronic system, and more specifically a radar system, mounted on or in the body of an aircraft. The electronic system is enclosed in a housing with at least one air inlet through which air for cooling of the electronic system can be provided, and wherein an air pipe is located between the air inlet and the electronic system. The inventive air heater is thereby mounted in the air pipe between the air inlet and the electronic system.

An electronic system with the inventive air heater mounted in its air pipe between the air inlet and the electronics, is able to operate in conditions from −55° C. and up to +30° C. and still keep the temperatures of the electronics components within the desired temperature range.

DETAILED DESCRIPTION

Figure 1:
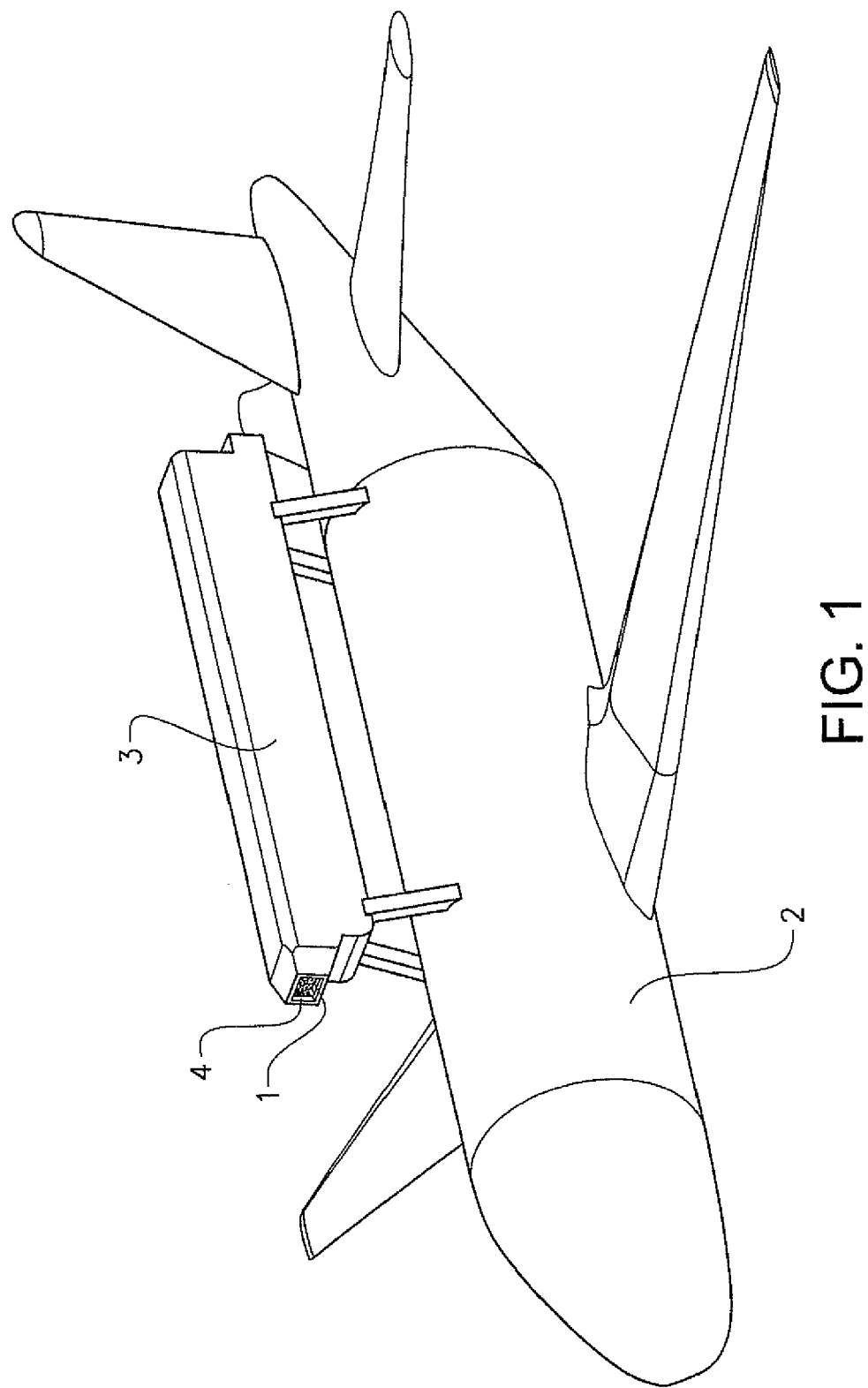
FIG. 1 shows an aircraft with a radar system mounted on its back.

All the FIGS. 1-4 are schematically illustrated. The inventive air heater 1 is to be used in electronic systems, i.e. a radar system, mounted in or on an aircraft 2 as shown in FIG. 1. The radar system 11 is arranged within a housing 3, wherein the housing 3 has an air inlet 4 to allow air flowing through the housing 3. The purpose of the airflow 9 is to cool the electronic components 10 of the radar system 11, such that they not get over heated during use of the electronic system. Still, to allow the use of industrial components in the radar system, the airflow 9 must be heated when the temperature of the air is below the first predetermined threshold values, i.e. −40° C.

Figure 2A:
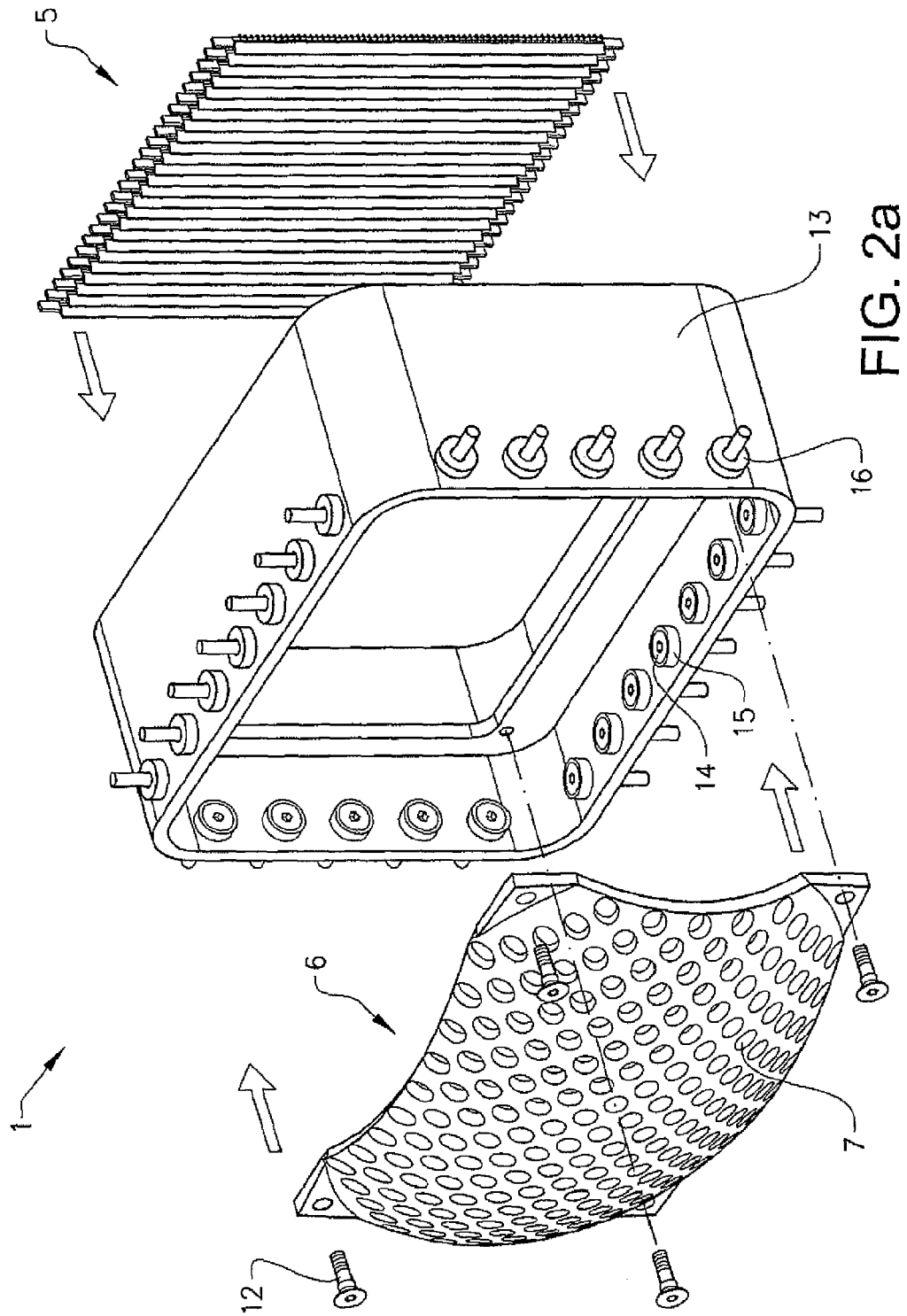
FIG. 2a shows explode drawing of an inventive air heater.
Figure 2B:
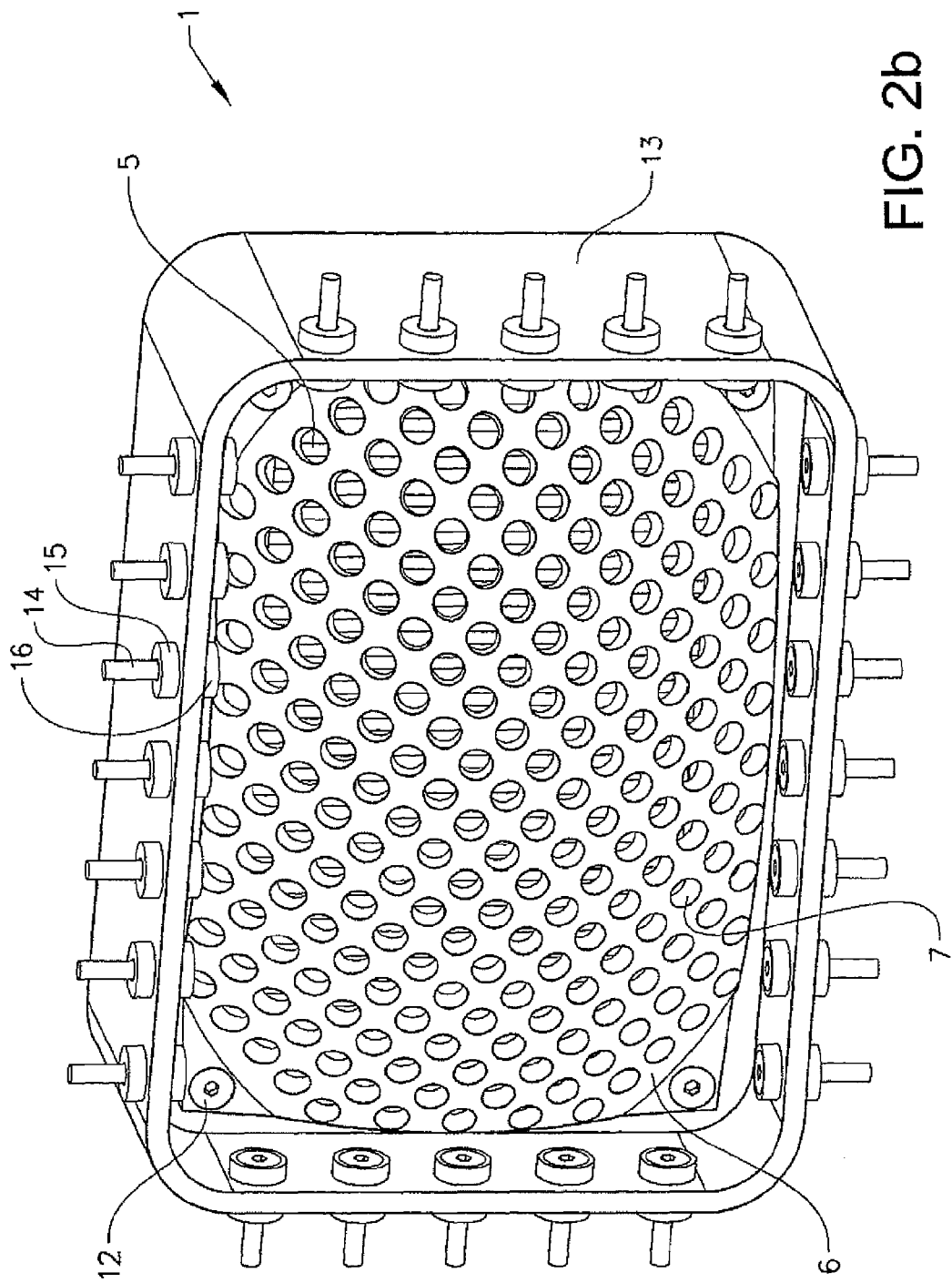
FIG. 2b shows an inventive air heater in a perspective view.

FIG. 2a shows an explode drawing of the inventive air heater 1 with heating means 5 and regulating means 6. In the example shown, the regulating means comprises a plate 6 with a plurality of openings 7. The plate is mounted with screws 12 in a frame 13 of the air heater 1. As can be seen in both FIGS. 2a and 2b, the plate 6 has a shape, such that its surface has a convex form, if looking at the plate 6 from the air inlet 4. Due to the convex shape, the plate 6 becomes a deformation zone. If the air heater 1 collides with a foreign object, the deformation zone reduces the impact on the air heater 1 and the surrounding structure, i.e. the housing 3. The deformation zone further creates a distance to the heating means 5 which thereby don't get hit if a foreign object collides with the air heater 1.

Figure 3:
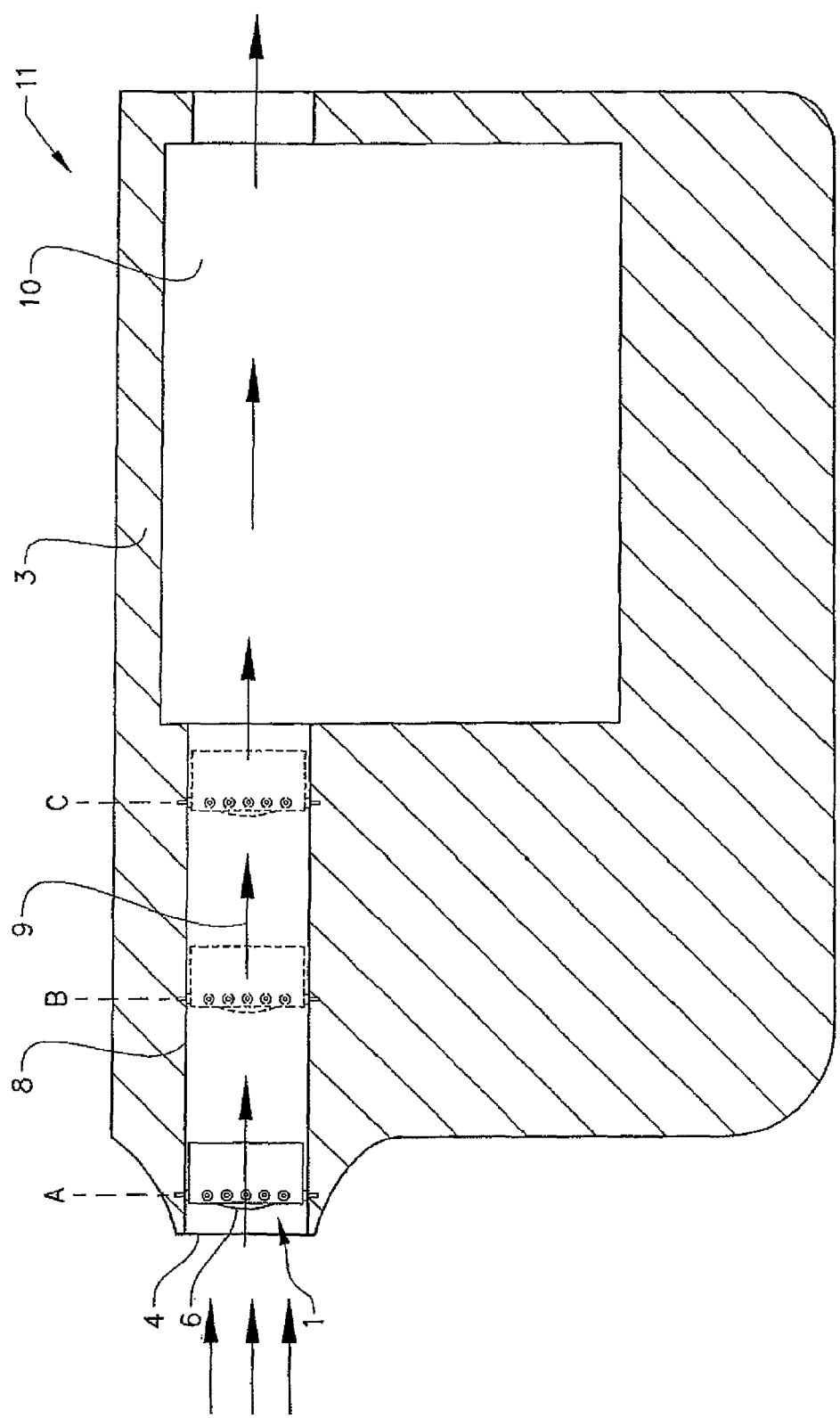
FIG. 3 shows a cross section through a housing of a radar system.

The openings 7 in plate 6, as seen in FIGS. 2a and b, is adapted such that they restrict the air flowing through the air pipe 8 shown in FIG. 3. Obviously, the heating means 5 also contribute to the reduction of the flow rate of the air flowing through the air heater 1. However, in the embodiment shown in the figures, the heating means 5 is constructed such that its contribution to the reduction of the flow rate of the airflow 9 is minimal.

In an embodiment of the inventive air heater 1 the heating means 5 and the regulating means 6 is integrally formed, such that the same unit achieves the result of both the regulating means 6 and the heating means 5. For example, the in FIG. 2 shown heating means 5 could be integrated in the regulating means 6, such that the heating means 6 can heat the airflow through the air heater 1 by itself.

The air heater 1 is mounted in the housing 3 of the radar system, with screws or bolts 14. Between the screws/bolts 14 and the frame 13 is insulating means 15, 16 arranged. Thereby, won't it be any heat transferred from the air heater 1 to the housing 3.

The air heater 1 is mounted in the housing 3 with screws/bolts 14 such, that the air heater can be removed if the radar system is going to be operated when the aircraft 2 is stationary on the ground.

As illustrated in FIG. 3, the air heater 1 can be mounted in different positions A, B, C in the air pipe 8. A first position A is located close to the air inlet 4; the position A facilitates an easy removal of the air heater 1. The two alternative positions B, C of the air heater 1 is closer to the electronic components 10 of the radar system 11.

As can be seen in FIG. 3, it is preferred that the regulating means 6 is mounted before the heating means 5 in the airflow 9.

The invention claimed is:

1. An air heater arranged in an air pipe of an electronic system of a radar antenna, wherein the electronic system is mounted on a body of an aircraft and the electronic system is enclosed in a housing with at least one air inlet that is adapted to provide outside air for cooling of the electronic system, wherein the air pipe is located between the air inlet and the electronic system, wherein the air heater is mounted in the air pipe between the air inlet and the electronic system, the air heater comprising:
 a heater and a regulator, wherein the regulator is invariable and is arranged to restrict an airflow through the air pipe, and wherein the heater is arranged and dimensioned to heat the restricted airflow such that a temperature of the restricted airflow after the restricted airflow has passed the heater is maintained above a first predetermined threshold value, and wherein a cooling effect of the restricted airflow on the electronic system is maintained above a second predetermined threshold value when the temperature of the restricted airflow is below a third predetermined threshold value, wherein the first predetermined threshold value is lower than the third predetermined threshold value, and the first, the second and the third predetermined threshold values are dependent on material properties of components arranged in the electronic system.

2. The air heater according to claim 1, wherein the first predetermined threshold value is −40° C., and the second predetermined threshold value is essentially 20 kW, and the third predetermined threshold value is +30° C.

3. The air heater according to claim 1, wherein the regulator is arranged to restrict the airflow such that, when the temperature of the airflow, before the heater, is below the first predetermined threshold value, and the maximum heating effect required to heat the restricted airflow to above the first predetermined threshold value, is less than essentially 20 kW.

4. The air heater according to claim 1, wherein, the regulator is arranged to restrict the airflow such that, when the temperature of the restricted airflow is below the third predetermined threshold value, the cooling effect of the restricted airflow, at a height corresponding to essentially 2120 meters above sea level, is at least essentially 20 kW.

5. The air heater according to claim 1, wherein, the regulator is adapted to restrict the airflow with 40 to 50% at a height equivalent to 7100 meters above sea level, a speed of the aircraft of 80 m/s Equivalent Air Speed, wherein the air temperature is −55° C.

6. The air heater according to claim 1, further comprising:
a detachable attachment unit configured to attach the air heater to the housing, such that the air heater can be fully demounted.

7. The air heater according to claim 1, wherein the regulator is mounted in the air pipe, closer to the air inlet than the heater, and wherein the air heater further comprises an impact protector located closer to the air inlet than the heater.

8. The air heater according to claim 7, wherein the impact protector is integrated with the regulator, wherein the regulator is adapted to deform, if the regulator is hit by a foreign object, and thereby reduce the impact force on the air heater and the surrounding structure.

9. The air heater according to claim 1, wherein a surface of the regulator has a convex shape, when looking at the regulator from the air inlet, such that a deformation zone is created by the convex shape.

10. The air heater according to claim 9, wherein the regulator comprises a plate placed in the airflow, said plate having at least one through opening.

11. The air heater according to claim 1, wherein the impact protector comprises bars or plates or a wire netting located in the airflow before the heater.

12. The air heater according to claim 1, wherein the heater and the regulator are integrally formed in one unit.

13. The air heater according to claim 1, further comprising:
insulation attached to the housing of the electronic system to insulate the air heater.

14. The air heater according to claim 13, wherein the insulation between the air heater and the housing is ceramic bushings.

15. An electronic system of a radar antenna, wherein the electronic system is mounted on or inside a body of an aircraft and the electronic system is enclosed in a housing with at least one air inlet that is adapted to provide outside air for cooling of the electronic system, and wherein an air pipe is located between the air inlet and the electronic system, the electronic system comprising:
an air heater mounted in the air pipe between the air inlet and the electronic system the air heater comprising a heater and a regulator, wherein the regulator is invariable and is arranged to restrict an airflow through the air pipe, and wherein the air heater is arranged and dimensioned to heat the restricted airflow such that a temperature of the restricted airflow after the restricted airflow has passed the heater is maintained above a first predetermined threshold value, and wherein a cooling effect of the restricted airflow on the electronic system is maintained above a second predetermined threshold value when the temperature of the restricted airflow is below a third predetermined threshold value, wherein the first predetermined threshold value is lower than the third predetermined threshold value, and the first, the second and the third predetermined threshold values are dependent on material properties of components arranged in the electronic system.

* * * * *